United States Patent [19]

Willberg et al.

[11] Patent Number: 4,993,588
[45] Date of Patent: Feb. 19, 1991

[54] APPARATUS FOR SEPARATING OBJECTS OF THE SAME KIND, IN PARTICULAR ELECTRONIC COMPONENTS SUCH AS INTEGRATED CIRCUITS

[75] Inventors: Hans-Heinrich Willberg, Altofing/Bad Feilnbach; Ekkehard Ueberreiter, Raubling; Thomas Ulrich, Stephanskirchen, all of Fed. Rep. of Germany

[73] Assignee: Multitest, Elektronische Systeme GmbH, Rosenheim-Aisingerwies, Fed. Rep. of Germany

[21] Appl. No.: 365,761

[22] Filed: Jun. 13, 1989

[30] Foreign Application Priority Data

Jun. 16, 1988 [DE]  Fed. Rep. of Germany ....... 3820540

[51] Int. Cl.⁵ ...................... B65G 47/08; B65G 47/88
[52] U.S. Cl. ..................................... 221/13; 221/23;
    221/172; 221/268; 29/729; 29/809; 227/116
[58] Field of Search ............... 221/163, 167, 194, 171,
    221/172, 268, 9, 10, 13, 22, 23, 289; 227/116;
    29/729, 743, 809, 822

[56] References Cited

U.S. PATENT DOCUMENTS

| 2,703,894 | 3/1955 | Goldberg | 221/172 |
| 2,979,229 | 4/1961 | Reeder et al. | 221/21 |
| 3,253,734 | 5/1966 | Eckhaus et al. | 221/171 X |
| 4,393,981 | 7/1983 | Wada et al. | 221/289 |
| 4,567,652 | 2/1986 | Gussman et al. | 29/809 X |
| 4,592,484 | 6/1986 | Pregermain | 221/13 |
| 4,703,858 | 11/1987 | Ueberreiter et al. | 221/13 |

FOREIGN PATENT DOCUMENTS 3217531 11/1983 Fed. Rep. of Germany .
3531120  1/1987 Fed. Rep. of Germany .
3638430  5/1988 Fed. Rep. of Germany .

Primary Examiner—Andres Kashnikow
Assistant Examiner—Kenneth DeRosa
Attorney, Agent, or Firm—Scully, Scott, Murphy & Presser

[57] ABSTRACT

An apparatus for separating objects of the same kind, in particular electronic components such as integrated circuits (IC's), that are delivered in succession in a sloping delivery passage, the apparatus having a stop member arranged in the region of the delivery passage that is displaced substantially transverse to the direction of delivery so that it holds back or holds fast the respective foremost object, and having a control circuit (P) that cyclically controls the displacing movement of the stop member, is to be designed so that while ensuring a relatively long service life it is suitable for use for different components, in particular with regard to their length. This is achieved by arranging a sensor in the region of the delivery passage after the stop member, in the delivery direction, which responds to the arrival of a released object and which is connected to the control circuit (P), and by arranging the control circuit (P) so that the cycle frequency and/or the ratio between the pressure applying and lifting off periods of the stop member is changed depending on the frequency of arrival or the frequency of removal of the released objects at the sensor.

12 Claims, 2 Drawing Sheets

APPARATUS FOR SEPARATING OBJECTS OF THE SAME KIND, IN PARTICULAR ELECTRONIC COMPONENTS SUCH AS INTEGRATED CIRCUITS

TECHNICAL FIELD OF THE INVENTION

The invention relates to apparatus for separating objects of the same kind, in particular electronic components such as integrated circuits (IC's), that are delivered in succession in a sloping delivery passage, said apparatus having a stop member arranged in the region of the delivery passage that is displaceable substantially transverse to the direction of delivery to retain, i.e. to hold back or hold fast, the respective foremost object, and having a control circuit that cyclically controls the displacing movement of the stop member.

BACKGROUND OF THE INVENTION AND PRIOR ART

In the manufacture of electronic components it is in many cases necessary, for various reasons, to separate the components which, for rational performance of the manufacture, run immediately one after the other through a guide or delivery passage. The need for separation arises, for example, in the testing of electronic components.

German Offenlegungsschrift No. 32 17 531 describes and illustrates an apparatus for separating electronic components comprising an elastic belt that circulates in the direction of flow through the component delivery passage and replaces a section of the wall of the delivery passage, and that is in contact with the leading components of a series of components in the delivery passage. By controlled forward movement and stopping of the conveyor belt as determined by a sensor, arranged after the conveyor belt in the direction of flow, which detects the progress of the respective first component leaving the delivery belt, a separation of the components can be effected in which the apparatus is independent of the respective lengths of the components, since the different lengths of the components can be taken into account by running the conveyor belt for different periods of time. In this known arrangement a relatively large amount of wear of the elastic conveyor belt has to be reckoned with, so that it has to be exchanged fairly often, with a substantial outlay in labour and time. In addition such a separating device takes up a relatively large amount of space, so that it is difficult to integrate when there are a plurality of delivery passages side by side forming a magazine.

In another apparatus for separating electronic components, described in German Offenlegungsschrift No. 35 31 120, two stop members are provided for separating them, these members being displaceable transverse to the delivery passage and respectively cooperating with two components lying one behind the other, the first stop member forming a stop for the respective first component while the second stop member presses on the component lying immediately behind it. The two stop members are operated so that only one stop member dips into the delivery passage at one time. When the respective second stop member dips in, the respective first component is released so that it slides further on, and is separated owing to the slope of the delivery passage. With this arrangement the separating device is dependent on the length of the components.

In German Offenlegungsschrift No. 36 38 430 an apparatus for separating electronic components has also already been disclosed in which separation occurs in that the respective foremost component of the delivery row, lying in front of a stop, is removed with the aid of a gripping device transverse to the delivery row and supplied to a testing head. In practice it has become evident that even in the case of such a removal of the components from the delivery row it is advantageous to separate the components so that the gripping device always grips a separated component. When the components are not separated and the components are pulled out transverse to the delivery row detachment problems can occur owing to the formation of flashes (injection molding flashes) on the ends of the components facing one another, which lead to functional problems, in particular with suction gripping devices.

OBJECT OF THE INVENTION

It is an object of the invention to design an apparatus of the kind described in the introduction so that while ensuring a relatively long service life it is suitable for use for components that differ in particular with regard to their length.

SUMMARY OF THE INVENTION

This object is achieved by the characterizing of claim 1.

In the arrangement according to the invention the residence period of the respective first component in the region of the stop member due to the action of the stop member varies depending on the given or a desired cycle frequency at the removal position or at a further processing position. This makes it possible to adapt the residence period and thus the rate of separation to a constant or variable frequency of arrival or removal, whereby separation results after the residence period of the respective first component in the region of the stop member has ended. By this means the separating apparatus can be adjusted to components of different lengths. Owing to the adaptability of the separation to different cycle frequencies at the removal position of the further processing position it is also possible for it to be adapted to different operating speeds of a processing or testing device arranged after the separating device. The solution according to the invention is functionally reliable, has a structure that is simple and economic to manufacture and has a long service life, since any wear at the stop member is negligibly small.

Within the scope of the invention it is possible, in order to change the separating frequency, to change the frequency of the impulses by which the stop member is urged against the component to be separated, the contact or pressure time during which the stop member is in contact with the component to be separated, and/or the release period during which the stop member is not in contact with the component.

Further developments of the invention in the subclaims contribute to a simple, economical and compact construction, reliable operation, simple installation and user-friendliness even when several delivery passages are associated as a magazine.

BRIEF DESCRIPTION OF THE DRAWINGS

The invention will now be explained in more detail with reference to exemplary embodiments shown in the drawings, in which.

DETAILED DESCRIPTION OF PREFERRED EMBODIMENTS OF THE INVENTION

Figure 1:
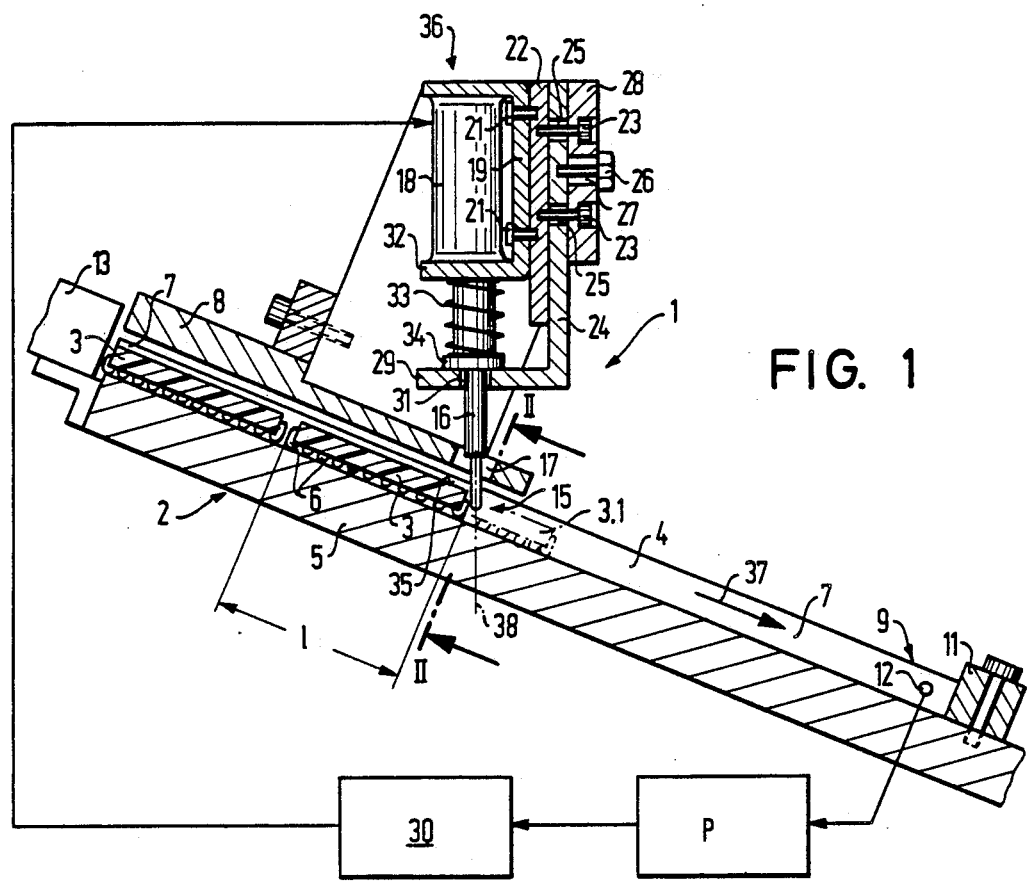
FIG. 1 shows, in vertical side elevation, an apparatus for separating integrated circuits (IC's) designed according to the invention.

Associated with the separating apparatus indicated generally by 1 is a magazine for IC's, indicated generally by 2. The magazine 2 is associated with a device (not shown) for testing electronic components, here the IC's 3, and it has a plurality of guide or delivery passages 4 extending parallel to one another which are arranged on a sloping magazine plate 5. The slope is so large that the IC's 3 slide downwards under their own weight in the delivery passages 4. Associated with each delivery passage 4 is a separating device 1.

Figure 2:
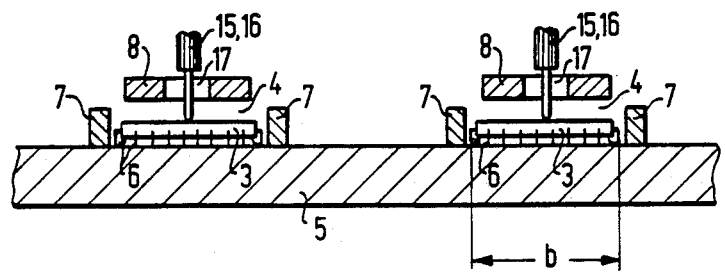
FIG. 2 shows the partial section II—II in FIG. 1.

In the exemplary embodiment shown in FIGS. 1 and 2 the magazine 2 and the delivery passages 4 are equipped to receive IC's 3 of a lamellar form with a housing of plastics material and contact elements arranged over the entire periphery. Such IC's are known in short as PLCC. The contact elements, indicated by 6, project beyond a wide face of the IC's. In the present exemplary embodiment this face points downwards, i.e. the IC's lie or slide on the downward-pointing contact elements 6 while the upper face is free of contact elements 6.

The delivery passages 4 are each formed or bounded by two lateral and one upper guiding strips 7, 8 which form the respective delivery passage 4 in which the IC's are received with some clearance.

The delivery passages 4 extend from the separating devices 1 arranged side by side for some distance to a removal position 9 for the IC's which is defined by a stop piece 11 bounding the delivery passage 4, to which the separated IC's 3 slide. In front of the stop piece 11 there is a sensor 12, preferably in the form of a light barrier, which can give a signal when there is a separated IC 3 at the removal position 9.

Provided at the upper end of the magazine plate 5 are magazine rods 13, indicated in outline, aligned with the delivery passages 4, which can be inserted into connectors or frames, not shown in detail, and can thus be exchanged in order to replace an empty magazine rod 13 by a magazine rod 13 filled with IC's 3.

Each separating device 1 has a stop member, indicated generally by 15, arranged above the delivery passage 4, in the form of a pin-like plunger 16 extending transverse to the delivery passage 4 and displaceable upwards and downwards, which can plunge through an opening 17 in the upper guide strip 8 into the cross-section of the delivery passage 4 and by contacting the IC 3 arranged in this region can stop it so that it does not slide further. At its end facing away from the delivery passage the plunger 16 is formed as an armature of an electric coil 18 or is connected to such an armature. The spool 18 is attached on the inside to a limb of an angled or U-shaped bracket 19 which is fastened by means of screws 21 to an intermediate plate 22. The intermediate plate 22 is likewise fastened by means of two screws 23 to an L-shaped guide piece 24, the screws 23 passing through the fastening part of the guide piece 24 in elongated holes 25. The guide piece 24 is also fastened to a fastening plate 28 in the same manner, i.e. by means of at least one screw 26 in an elongated hole 27, the elongated holes 25, 27 extending substantially vertically. In this manner the stop member 15 can be adjusted and fastened transverse to the magazine plate 5 with regard to its height (screw 26) and its stroke (screw 23). The fastening plate 28 is part of a support 30 which is arranged and held on the magazine plate 5 or on the guide strips 7, 8.

The plunger 16 passes through the guide limbs 29 of the guide piece 24 in a guide hole 31, whereby it obtains reliable guidance from the guide hole (not shown) also arranged in the lower limb 32 of the support 19. Inserted between the limbs 29, 32 is a compression spring 33 which is supported on the limb 32 and which acts against an annular attachment 34 of the plunger 16 that bears against the guide limb 29. The plunger 16 is thus prestressed in its pushed out end stroke position. This end stroke position should be lower than the upper face 35 of the IC's 3 to be separated so that the stop member 15 is biased against the IC 3 and pushes this against the base on which it rests and thereby prevents it from sliding further. The prestressing should be strong enough to stop the IC 3 to be separated reliably even against the weight resulting when there is a long row of IC's 3 in the magazine rod 13.

With a new load of IC's in the respective delivery passage 4 the first IC 3 to be separated bumps into the stop member 15 which thus acts as a stop. In contrast, after separation has begun, the stop member 15 is always at the upper face 35 of the IC 3 to be separated whereby the latter can take up a position which is indicated in outline in FIG. 1 by 3.1. This position however is not fixed and can be varied.

The sensor 12 is connected by an electric control line to a processor P which is connected by a further electric control line via a current control circuit 30 to the electromagnetic drive, indicated generally by 36, of the plunger 16 and controls the latter so that the plunger 16 is lifted off from the IC 3 to be separated at a specific cycle frequency and owing to the spring force pushes against the IC again. By decreasing or increasing the cycle frequency of the plunger 16, the pressure applying period of the plunger 16 on the IC 3 and/or the lifting off period of the plunger 16 from the IC 3, the period of residence of the IC's 3 to be separated in the region of the stop member 15, and thus the speed of separation, can be controlled or regulated. In the present case the speed of the separation is controlled according to the arrival sequence frequency or the removal sequence frequency at the removal position 9. In other words, the separation is adapted to the further passage of the IC's 3 after the separating device 1, and it can also be adapted to the speed of removal at the removal position 9. The arrangement is preferably such that the stop member 15 contacts each IC 3 to be separated at least two or three times. Since there is no predetermined specific position of the IC 3 to be separated relative to the stop member 16, this prevents the IC 3 following the IC 3 to be separated from sliding through unintentionally when there is a relatively high pressure, resulting from a long row of IC's 3, acting in the delivery direction (generally indicated by 37).

Since the plunger 16 is urged towards its stopping position by the spring force the stopping function is also ensured in case of power failure, so that when the current is restored the separating device 1 can continue working without interruption.

The separation is preferably controlled by increasing or shortening either the pressure applying period of the plunger 16 or the lifting off period of the plunger 16. This functions in more detail as follows: After the departure of a separated IC 3 from the stop member 15 the plunger 16 acts on the following IC 3 that has slid up to and is located beneath it at least twice in the cycle sequence, while the sensor 12 checks whether the IC 3 that has departed has arrived. When the sensor 12 signals the removal of the IC 3 at the removal position 9, the IC 3 now to be separated is released. If however, even in the case of longest pressure applying periods (for elongated IC's), an IC is not signalled by the sensor 12 the processor P automatically determines that the delivery passage 4 concerned is empty or at least one IC 3 is jammed therein. A signal can then be given and/or the delivery passageway 4 or a subsequent delivery passage 4 can be brought into use and its stop member 15 can be controlled by the processor P.

Particularly in the case of relatively long distances between the separating device 1 and the removal position 9, it is also possible for the IC 3 to be separated to be released before the sensor 12 has signalled the removal at the removal position 9. The processor P is programmed correspondingly.

When the IC's 3 slide down, the pressure on the first IC 3 becomes less as the row of IC's in front of the stop member 15 becomes shorter. This means that the IC's 3 obtain a longer sliding period. The cycle period or frequency of the stop member 15 is increased correspondingly (self-regulation). Independently of this the shortest cycle frequency is stored and when this or a next delivery passage 4 is brought into operation this is used as control criterion.

In this way a separating device 1 is provided which is completely independent of the length 1 of the IC's and also of their width b and their weight.

Within the scope of the invention it is possible to arrange the stopping device having the stop member 15 so that the longitudinal axis 38 of the plunger 16 is inclined in or against the delivery direction 37: see FIG. 1 in which it is inclined against the delivery direction. In an embodiment of this kind the stop member 15 effects a longitudinal movement on the IC 3 to be separated by contacting it, whereby static friction is prevented or at least reduced and the through-flow is improved.

Figure 3:
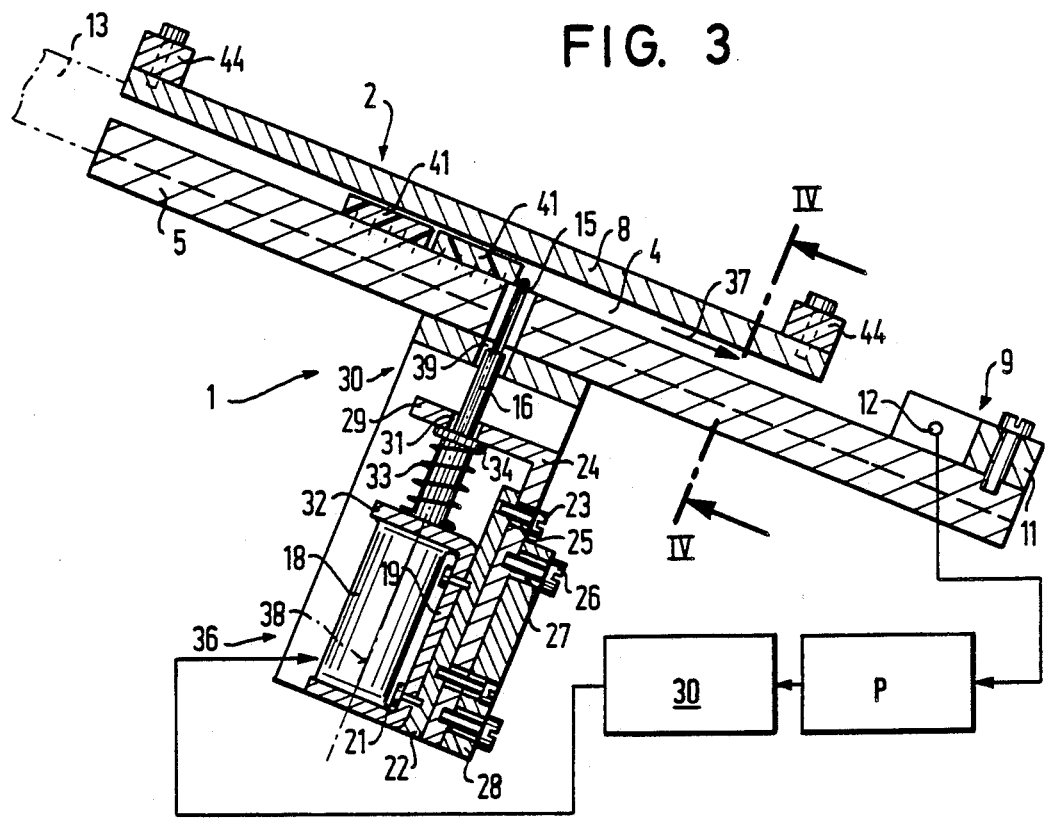
FIG. 3 shows a modified embodiment of the apparatus in vertical side elevation.
Figure 4:
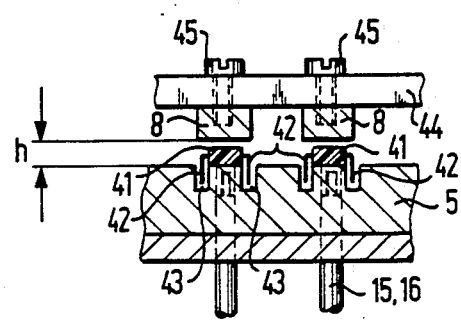
FIG. 4 shows the partial section IV—IV in FIG. 3.

The exemplary embodiment shown in FIGS. 3 and 4 operates in principle according to the first exemplary embodiment. Here however, the separating device 1 is arranged below the associated delivery passage 4, i.e. the support 30 is fastened to the bottom of the magazine plate 5 and the plunger 16 is moved through an opening 39 in the magazine plate 5 from below into the delivery passage 4, acts against the underside of the IC, here indicated by 41, and presses it against the upper guide strip 8 during the stopping function. In the present exemplary embodiment this separating device 1 serves to separate so-called "dual in line" IC's 41 which only have contact elements 42 on two sides. In the present exemplary embodiment the contact elements 42 point downwards and dip into two guide grooves 43 in the delivery passage 4. The lateral guidance for the IC's 41 is hereby ensured so that separate lateral guide strips 7, as in the first exemplary embodiment, can be dispensed with. It can be seen in FIG. 4 that the upper guide strips 8 are fastened underneath by means of screws 45 to carrier strips 44 extending transverse to the delivery passages 4 which carry several or all the upper guide strips 8. The carrier strips 44 are preferably arranged so that they can be adjusted in height in a manner not shown so that the height h of the delivery passage 4 can be adjusted and adapted to the IC's to be processed.

In comparable manner it is also advantageous to arrange the upper and the lateral guide strips 7, 8 shown in FIG. 1 so that they can be adjusted vertically and laterally and can be fixed in the respective position after adjustment so that the height h and width b of the delivery passages 4 can be adapted to the cross-sectional dimensions of the IC's 3 to be processed.

What is claimed is:

1. Apparatus for separating objects of the same kind, in particular electronic components, such as integrated circuits, which are delivered in succession in a sloping delivery passage, said apparatus having a stop member arranged in the region of the delivery passage displaceable substantially transverse to the direction of delivery so as to respectively retain a leading one of the objects, and having a control circuit which cylically controls the displacing movement of the stop member, in the region of the delivery passage downstream of the stop member in the delivery direction, there is arranged a sensor which responds to the arrival of a released object and which is connected to the control circuit, said control circuit being arranged so that selectively the cycle frequency and the ratio of the pressure applying and lifting off periods of the stop member are changed depending on the frequency of arrival and in the removal of the released objects at the sensor, said control circuit regulating the cycle frequency of the stop member so that the stop member contacts each object at least twice.

2. Apparatus according to claim 14 wherein the control circuit is arranged so that at least one of the cycle frequency and the pressure applying period of the stop member is reduced when the frequency of the arrival sequence or of removal is reduced and the pressure applying period increased when the frequency of arrival or removal sequence is increased.

3. Apparatus according to claim 1 wherein the stop member can be displaced by means of an electromagnet.

4. Apparatus according to claim 1 wherein the stop member is urged by spring force towards the object to be separated and a displacement drive serving to displace the stop member acts against the spring force.

5. Apparatus according to claim 1 wherein the stop member is displaceable transverse to the upper side of the object cooperating with it and can be held in the respective displaced position.

6. Apparatus according to claim 1 wherein the stroke of the stop member can be adjusted.

7. Apparatus according to claim 1 wherein the stop member is arranged above the delivery passage.

8. Apparatus according to claim 1 wherein the stop member is arranged beneath the delivery passage.

9. Apparatus according to claim 1 wherein the stop member is a plunger displaceable transverse to the delivery direction.

10. Apparatus according to claim 9 wherein the plunger cooperates with an upper side of each of the electronic components opposite electrical connecting contacts on the components.

11. Apparatus according to claim 9 wherein grooves are formed in at least one wall of the delivery passage for electrical contact elements of each electronic component.

12. Apparatus according to claim 9 wherein the axis of the plunger is at an acute or obtuse angle to the direction of delivery.

* * * * *